(12) United States Patent
Lin (10) Patent No.: US 12,429,760 B2
(45) Date of Patent: *Sep. 30, 2025

(54) METHOD FOR FORMING STRUCTURE OF PELLICLE-MASK STRUCTURE WITH VENT STRUCTURE

(71) Applicant: Taiwan Semiconductor Manufacturing Company, Ltd., Hsinchu (TW)

(72) Inventor: Yun-Yue Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/654,329

(22) Filed: May 3, 2024

(65) Prior Publication Data

US 2024/0280894 A1  Aug. 22, 2024

Related U.S. Application Data

(63) Continuation of application No. 17/461,323, filed on Aug. 30, 2021, now Pat. No. 12,007,685, which is a continuation of application No. 15/888,633, filed on Feb. 5, 2018, now Pat. No. 11,106,127.

(60) Provisional application No. 62/583,126, filed on Nov. 8, 2017.

(51) Int. Cl.
*G03F 1/64* (2012.01)
*G03F 1/22* (2012.01)

(52) U.S. Cl.
CPC . *G03F 1/64* (2013.01); *G03F 1/22* (2013.01)

(58) Field of Classification Search
CPC ..................................... G03F 1/62; G03F 1/64
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |

(Continued)

OTHER PUBLICATIONS

U.S. Office Action for U.S. Appl. No. 17/497,337, dated Mar. 20, 2023.

*Primary Examiner* — Daborah Chacko-Davis
(74) *Attorney, Agent, or Firm* — Birch, Stewart, Kolasch & Birch, LLP (57) ABSTRACT

A method for forming a structure of a pellicle-mask structure is provided. The method includes forming a mask pattern on a mask substrate. The method also includes bonding a pellicle frame to the mask pattern through a pellicle frame adhesive. The method further includes forming a vent structure in the pellicle frame. In addition, the method includes bonding a pellicle membrane to the pellicle frame. The pellicle membrane includes a peripheral portion over the pellicle frame and a top membrane portion over the peripheral portion, and a lateral width of the peripheral portion of the pellicle membrane is greater than a lateral width of the pellicle frame adhesive.

20 Claims, 9 Drawing Sheets

(56) References Cited

U.S. PATENT DOCUMENTS

| | | |
|---|---|---|
| 9,548,303 B2 | 1/2017 | Lee et al. |
| 11,106,127 B2 | 8/2021 | Lin |
| 11,143,952 B2 | 10/2021 | Yoo et al. |
| 12,007,685 B2 * | 6/2024 | Lin .......................... G03F 1/64 |
| 12,013,632 B2 * | 6/2024 | Yoo .......................... G03F 1/62 |
| 2002/0090558 A1 | 7/2002 | Shirasaki |
| 2002/0181092 A1 | 12/2002 | Wang |
| 2006/0110664 A1 | 5/2006 | Hamada |
| 2017/0184957 A1 | 6/2017 | Kohmura et al. |
| 2017/0343894 A1 | 11/2017 | Ishito |
| 2018/0284598 A1 | 10/2018 | Schnieders |
| 2018/0329314 A1 | 11/2018 | Kruizinga et al. |
| 2019/0094683 A1 | 3/2019 | Yoo et al. |

* cited by examiner

METHOD FOR FORMING STRUCTURE OF PELLICLE-MASK STRUCTURE WITH VENT STRUCTURE

PRIORITY CLAIM AND CROSS-REFERENCE

This application is a Continuation of pending U.S. patent application Ser. No. 17/461,323, filed Aug. 30, 2021 and entitled "METHOD FOR FORMING STRUCTURE OF PELLICLE-MASK STRUCTURE WITH VENT STRUCTURE", which claims the benefit of U.S. patent application Ser. No. 15/888,633, filed Feb. 5, 2018 and entitled "STRUCTURE OF PELLICLE-MASK STRUCTURE WITH VENT STRUCTURE", which claims the benefit of U.S. Provisional Application No. 62/583,126 filed Nov. 8, 2017, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by subsequently depositing insulating or dielectric layers, conductive layers, and semiconductive layers of material over a semiconductor substrate, and patterning the various material layers using lithography to form circuit components and elements thereon.

One important driver for increasing performance in a semiconductor device is the higher levels of integration of circuits. This is accomplished by miniaturizing or shrinking device sizes on a given chip. Extreme ultraviolet (EUV) lithography technology has been developed in order to transfer finer patterns onto wafers. The EUV lithography technology is considered a next-generation technology which will be used to fabricate a slimmer and faster microchip.

However, although the existing EUV lithograph technology has been generally adequate for its intended purpose, as device scaling-down continues, it has not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additional features can be added to the pellicle-mask structure. Some of the features described below can be replaced or eliminated for different embodiments. Although some embodiments are discussed with operations performed in a particular order, these operations may be performed in another logical order.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 1:
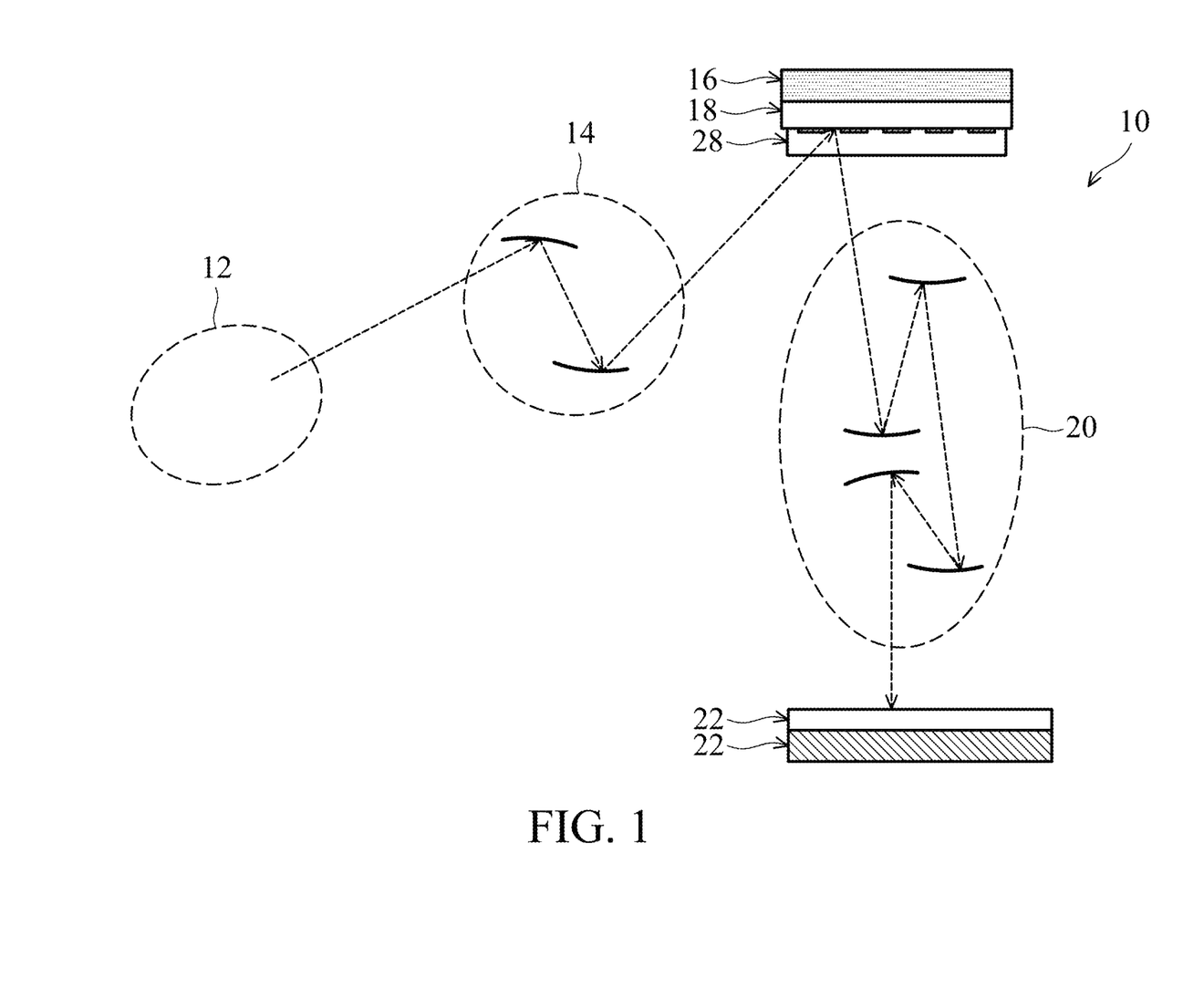
FIG. 1 shows a schematic view of a lithography system with a high-brightness light source, in accordance with some embodiments.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

The lithography system 10 includes a high-brightness light source 12, an illuminator 14, a mask stage 16, a mask 18, a projection optics module (or projection optics box (POB)) 20 and a substrate stage 24, in accordance with some embodiments. The elements of the lithography system 10 can be added to or omitted, and the embodiments of the present disclosure should not be limited by the embodiment.

The high-brightness light source 12 is configured to generate radians having a wavelength ranging between about 1 nm and about 200 nm. In one particular example, the high-brightness light source 12 generates an EUV light with a wavelength centered at about 13.5 nm. Accordingly, in some embodiments, the high-brightness light source 12 is also referred to as EUV light source. However, it should be appreciated that the high-brightness light source 12 should not be limited to emitting EUV light. The high-brightness light source 12 can be utilized to perform any high-intensity photon emission from excited target material.

The term "about" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the high-brightness light source 12 onto a mask stage 16, particularly to a mask 18 secured on the mask stage 16. In the present embodiments where the high-brightness light source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably. In the present embodiments, the mask 18 is a reflective mask.

In some embodiments, a pellicle structure 28 is positioned over the mask 18, as shown in FIG. 1. In some embodiments, the pellicle structure 28 protects the mask 18 from particles and keeps the particles out of focus so that they do not produce an image, which may cause defects during the lithography process.

The projection optics module (or projection optics box (POB)) 20 is configured for imaging the pattern of the mask 18 on to a semiconductor wafer 22 secured on a substrate stage 24 of the lithography system 10. In some embodiments, the POB 20 has refractive optics (such as for a UV lithography system) or alternatively reflective optics (such as for an EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

In some embodiments, the semiconductor wafer 22 is a bulk semiconductor wafer. For example, the semiconductor wafer 22 is a silicon wafer. The semiconductor wafer 22 may include silicon or another elementary semiconductor material such as germanium. In some other embodiments, the semiconductor wafer 22 includes a compound semiconductor. The compound semiconductor may include gallium arsenide, silicon carbide, indium arsenide, indium phosphide, another suitable material, or a combination thereof.

In some embodiments, the semiconductor wafer 22 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor wafer 22 is an un-doped substrate. However, in some other embodiments, the semiconductor wafer 22 is a doped substrate such as a P-type substrate or an N-type substrate.

In some embodiments, the semiconductor wafer 22 includes various doped regions (not shown) depending on design requirements of the semiconductor device structure. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, an interconnection structure is formed over the semiconductor wafer 22. The interconnection structure includes multiple interlayer dielectric layers including dielectric layers. The interconnection structure also includes multiple conductive features formed in the interlayer dielectric layers. The conductive features may include conductive lines, conductive vias, and/or conductive contacts.

In some embodiments, various device elements are formed in the semiconductor wafer 22. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

The device elements are interconnected through the interconnection structure over the semiconductor wafer 22 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

In some embodiments, the semiconductor wafer 22 is coated with a resist layer sensitive to the EUV light In the present embodiments. Various components including those described above are integrated together and are operable to perform lithography exposing processes.

Figure 2A:
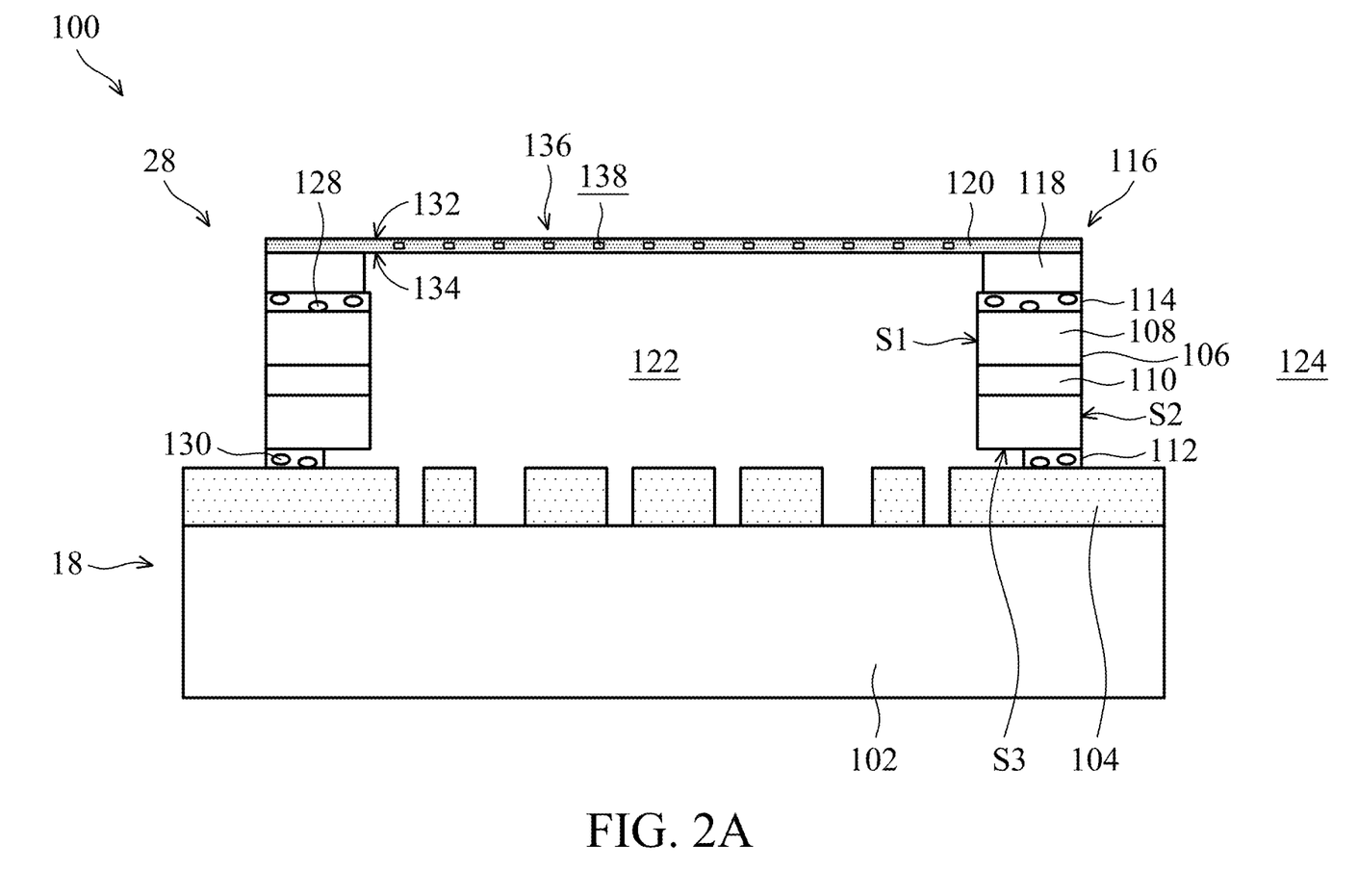
FIG. 2A is a cross-sectional view of a pellicle-mask structure in accordance with some embodiments of the present disclosure.
Figure 2B:
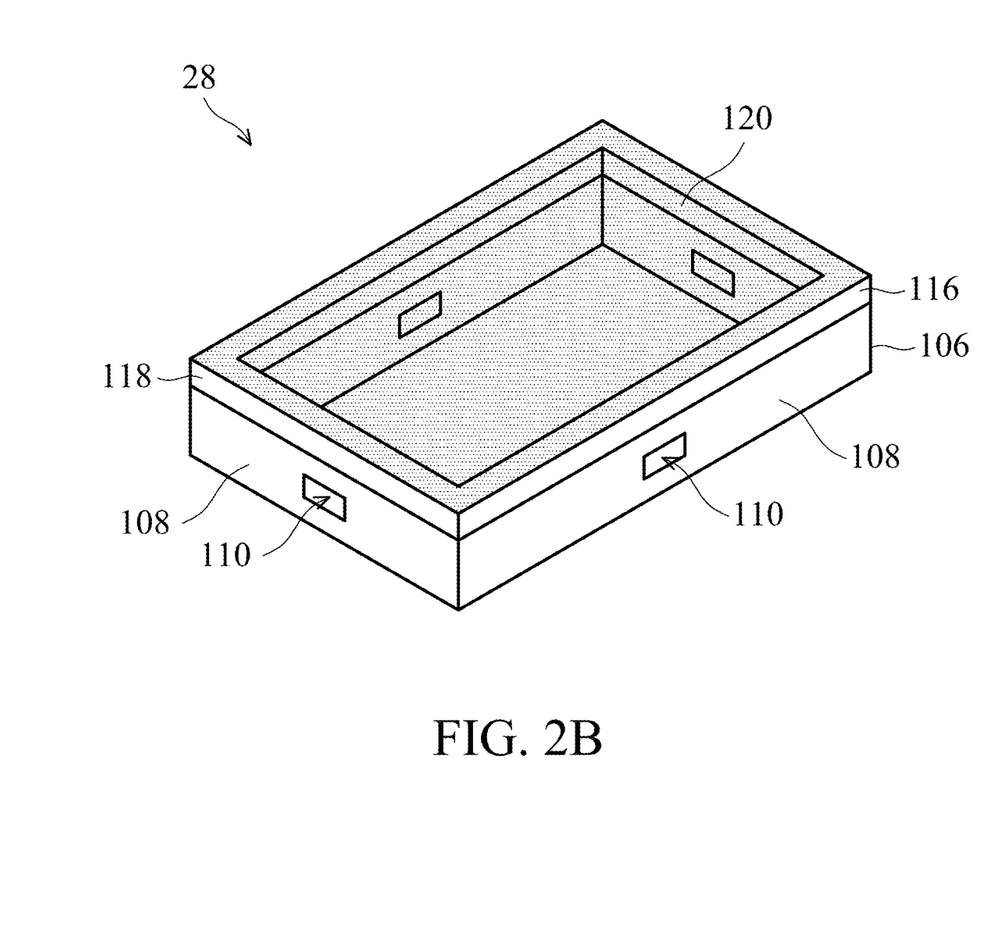
FIG. 2B is a side view of a pellicle structure in accordance with some embodiments of the present disclosure.

FIG. 2A is a cross-sectional view of a pellicle-mask structure 100 in accordance with some embodiments of the present disclosure. FIG. 2B is a side view of a pellicle structure 28 in accordance with some embodiments of the present disclosure. It should be noted that the mask 18 is not shown in FIG. 2B in order to clearly describe the embodiments of the present disclosure. It should be noted that the pellicle membrane adhesive and the pellicle frame adhesive are also not shown in FIG. 2B in order to clearly describe the embodiments of the present disclosure.

As shown in FIGS. 2A and 2B, pellicle-mask structure 100 includes the mask 18, in accordance with some embodiments. As shown in FIG. 2A, the mask 18 includes a mask substrate 102 and a mask pattern 104 positioned over the mask substrate 102, in accordance with some embodiments.

In some embodiments, mask substrate 102 is a transparent substrate, such as fused silica ($SiO_2$) relatively free of defects, borosilicate glass, soda-lime glass, calcium fluoride, low thermal expansion material, ultra-low expansion material, or other applicable materials. Mask pattern 104 positioned over the mask substrate 102 may be designed according to integrated circuit features to be formed over a semiconductor substrate during a lithography patterning process. Mask pattern 104 may be formed by depositing a material layer and patterning the material layer to have one or more openings where radiation beams may travel through without being absorbed, and one or more absorption areas where the radiation beams may be completely or partially blocked thereby.

The mask pattern 104 may include metal, metal alloy, metal silicide, metal nitride, metal oxide, metal oxynitride or other applicable materials. Examples of materials used to form mask pattern 104 may include, but are not limited to, Cr, $Mo_xSi_y$, $Ta_xSi_y$, Mo, $Nb_xO_y$, Ti, Ta, $Cr_xN_y$, $Mo_xO_y$, $Mo_xN_y$, $Cr_xO_y$, $Ti_xN_y$, $Zr_xN_y$, $Ti_xO_y$, $Ta_xN_y$, $Ta_xO_y$, $Si_xO_y$, $Nb_xN_y$, $Si_xN_y$, $Zr_xN_y$, $Al_xO_yN_z$, $Ta_xB_yO_z$, $Ta_xB_yN_z$, $Ag_xO_y$, $Ag_xN_y$, Ni, $Ni_xO_y$, $Ni_xO_yN_z$, and or the like. The compound x/y/z ratio is not limited.

In some embodiments, the mask 18 is an EUV mask. In some other embodiments, the mask 18 is an optical mask.

Still referring to FIGS. 2A and 2B, the pellicle structure 28 is positioned over the mask 18, in accordance with some embodiments. As shown in FIGS. 2A and 2B, the pellicle structure 28 includes a pellicle frame 106 positioned over the mask substrate 102 and/or the mask pattern 104, in accordance with some embodiments.

In some embodiments, the pellicle frame 106 is made of ceramic material, metal material, glass-ceramic material, another suitable material, or a combination thereof. In some embodiments, suitable process for forming the pellicle frame 106 includes machining process, injunction molding process, sintering process, photochemical etching process, another applicable process, or a combination thereof.

Still referring to FIGS. 2A and 2B, the pellicle frame 106 includes a side portion 108 with an inside surface S1 and an outside surface S2 opposite to each other, in accordance with some embodiments. As shown in FIGS. 2A and 2B, the pellicle frame 106 further includes a bottom surface S3 connecting the inside surface S1 and the outside surface S2, in accordance with some embodiments.

As shown in FIGS. 2A and 2B, the pellicle-mask structure 100 further includes a vent structure 110 in the side portion 108 and connecting the inside surface S1 and the outside surface S2, in accordance with some embodiments. In some embodiments, the vent structure 110 is made of ceramic material, metal material, glass-ceramic material, another suitable material, or a combination thereof. In some embodiments, the vent structure 110 is made of a different material than the pellicle frame 106. In some other embodiments, the vent structure 110 has a material the same as that of the pellicle frame 106.

In some embodiments, the vent structure 110 is made with the pellicle frame 106 together. In some embodiments, the vent structure 110 is made by a photochemical etching process, another applicable process, or a combination thereof.

In some other embodiments, the vent structure 110 and the pellicle frame 106 are made separately, and an opening (not shown) is formed in the side portion 108 of the pellicle frame 106. Afterwards, in some embodiments, the vent structure 110 is placed into the opening in the side portion 108 of the pellicle frame 106. Afterwards, in some embodiments, the vent structure 110 is bonded to the pellicle frame 106 by a brazing process, a direct diffusion bond process, a eutectic bonding process, another applicable process, or a combination thereof.

In some embodiments, the vent structure 110 is used to prevent the pellicle membrane from breaking during the EUV lithography processes.

Still referring to FIGS. 2A and 2B, the pellicle-mask structure 100 further includes a pellicle frame adhesive 112 between the pellicle frame 106 and the mask substrate 102, in accordance with some embodiments.

In some embodiments, the pellicle frame adhesive 112 is made of crosslink type adhesive, thermoplastic elastomer type adhesive, polystyrene type adhesive, acrylic type adhesive, epoxy type adhesive, or a combination thereof.

In some embodiments, a surface treatment is performed on the pellicle frame 106 to enhance the adhesive property of the pellicle frame 106 to the pellicle frame adhesive 112. In some embodiments, the surface treatment includes an oxygen plasma treatment, another applicable treatment, or a combination thereof. However, the embodiments of the present disclosure are not limited thereto. In some other embodiments, no surface treatment is performed on the pellicle frame 106.

Still referring to FIGS. 2A and 2B, the pellicle-mask structure 100 further includes a pellicle membrane adhesive 114 over the pellicle frame 106, in accordance with some embodiments. In some embodiments, the pellicle membrane adhesive 114 is made of thermoplastic elastomer type adhesive, acrylic type adhesive, epoxy type adhesive, polystyrene type adhesive, another suitable material, or a combination thereof. In some embodiments, the pellicle membrane adhesive 114 is made of a material that is different from that of the pellicle frame adhesive 112.

Still referring to FIGS. 2A and 2B, the pellicle-mask structure 100 further includes a pellicle membrane 116 positioned over the pellicle frame 106 and the pellicle membrane adhesive 114, in accordance with some embodiments. As shown in FIGS. 2A and 2B, the pellicle membrane adhesive 114 is positioned between the pellicle membrane 116 and the pellicle frame 106, in accordance with some embodiments.

In some embodiments, the pellicle membrane 116 includes a peripheral portion 118 over the pellicle membrane adhesive 114, and a top membrane portion 120 over the peripheral portion 118. In some embodiments, the peripheral portion 118 is made of boron carbide, Si, C, Graphene, carbon nanotube, SiC, SiN, $SiO_2$, SiON, Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, another suitable material, allotrope thereof, or a combination thereof. In some embodiments, the top membrane portion 120 is made of boron carbide, Si, C, SiC, SiN, $SiO_2$, SiON, Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, another suitable material, or a combination thereof. In some embodiments, the peripheral portion 118 and/or the top membrane portion 120 includes multiple layers. In some embodiments, the pellicle membrane 116 is made by substrate backside photo/etching process, another applicable process, or a combination thereof.

In some embodiments, the material of the peripheral portion 118 is the same as the material of the top membrane portion 120. In some other embodiments, the material of the peripheral portion 118 is different from the material of the top membrane portion 120. In some embodiments, the thickness of the top membrane portion 120 is in a range from about 10 nm to about 100 nm, for example from about 20 nm to about 50 nm.

As shown in FIG. 2A, the pellicle structure 28 and the mask 18 form an enclosed inner space 122 enclosed by the pellicle structure 28 and the mask 18, in accordance with some embodiments. As shown in FIG. 2A, the pellicle structure 28 and the mask 18 separate the inner space 122 from an outer space 124, in accordance with some embodiments. As shown in FIG. 2A, the vent structure 110 connects the inner space 122 and the outer space 124, in accordance with some embodiments.

In some cases, the EUV lithography process is performed under an extremely high vacuum environment. However, in some cases, the pellicle-mask structure does not include the vent structure. Therefore, the pressure in the inner space cannot be balanced with the pressure in the outer space. As a result, the pellicle membrane may be broken due to the pressure difference.

In some embodiments, since the pellicle-mask structure 100 includes the vent structure 110 connecting the inner space 122 and the outer space 124, the pressure in the inner space 122 can be balanced with the pressure in the outer space 124 when the EUV lithography process is being performed. As a result, the vent structure 110 prevents the pellicle membrane 116 from breaking when the EUV lithography processes are being performed.

In some embodiments, the pellicle frame 106 has side portions 108, and the pellicle-mask structure 100 includes at least one vent structure 110 positioned in the side portions 108. In some embodiments, as shown in FIG. 2B, the pellicle frame 106 includes four side portions 108, and the pellicle-mask structure 100 includes four vent structures 110. In some embodiments, the four vent structures 110 are positioned in the four side portions 108 respectively. Many variations and/or modifications can be made to embodiments of the disclosure. In some embodiments, the pellicle-mask structure 100 includes more vent structures 110. In some embodiments, more than two vent structures 110 are formed in one side portion 108. In some embodiments, only one vent structure 110 is formed in one side portion 108, and there is no vent structure 110 in the other three side portions 108. In some embodiments, the area of one vent structures 110 is equivalent to that of one side portion 108.

Figure 3A:
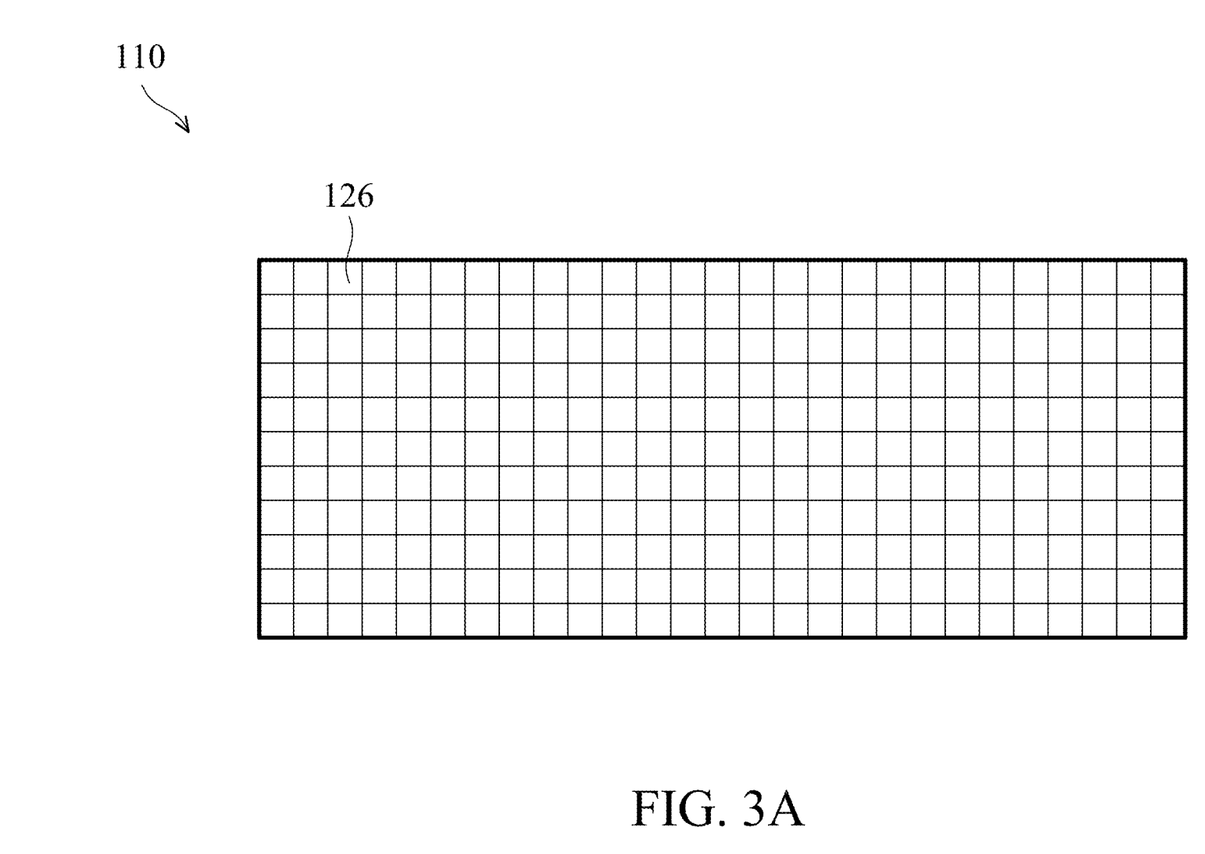
FIG. 3A is a cross-sectional view of a vent structure in accordance with some embodiments of the present disclosure.

FIG. 3A is a cross-sectional view of the vent structure 110 in accordance with some embodiments of the present disclosure. As shown in FIG. 3A, the vent structure 110 includes a number of sub-ventilation holes 126, and the sub-ventilation holes 126 have a rectangular shape, in accordance with some embodiments. As shown in FIG. 3A, the vent structure 110 has a rectangular shape, in accordance with some embodiments. In addition, as shown in FIG. 3A, the sub-ventilation holes 126 are distributed evenly. As shown in FIG. 3A, the sub-ventilation holes 126 have substantially the same size. In some embodiments, the size of the sub-ventilation holes 126 is in a range from about 10 nm to about 100 μm, for example from about 100 nm to about 10 μm. As shown in FIG. 3A, the vent structure 110 including the sub-ventilation holes 126 has a fibrous network structure.

Figure 3B:
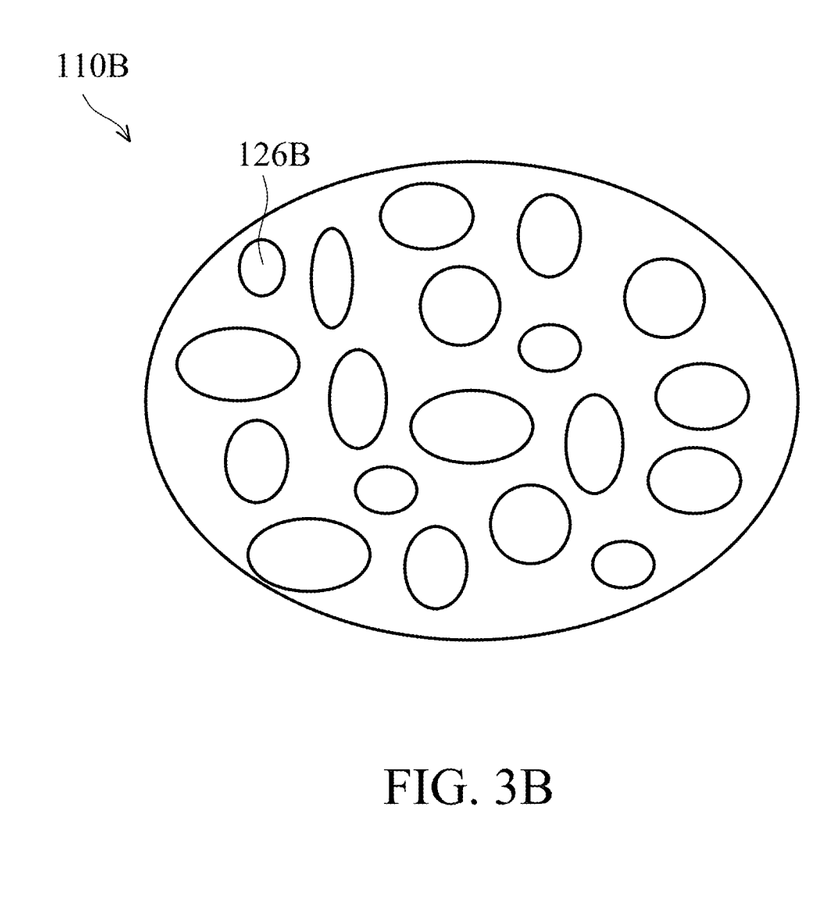
FIG. 3B is a cross-sectional view of a vent structure in accordance with some other embodiments of the present disclosure.

FIG. 3B is a cross-sectional view of the vent structure 110B in accordance with some embodiments of the present disclosure. As shown in FIG. 3B, the vent structure 110B includes a number of sub-ventilation holes 126B, and the sub-ventilation holes 126B have a circular shape, in accordance with some embodiments. As shown in FIG. 3B, the vent structure 110B has a circular shape, in accordance with some embodiments. In addition, as shown in FIG. 3B, the sub-ventilation holes 126B are distributed unevenly. As shown in FIG. 3B, the size of one of the sub-ventilation holes 126B is different than the size of another one of the sub-ventilation holes 126B. As shown in FIG. 3B, the vent structure 110B including the sub-ventilation holes 126B has a mesa-porous structure.

Figure 3C:
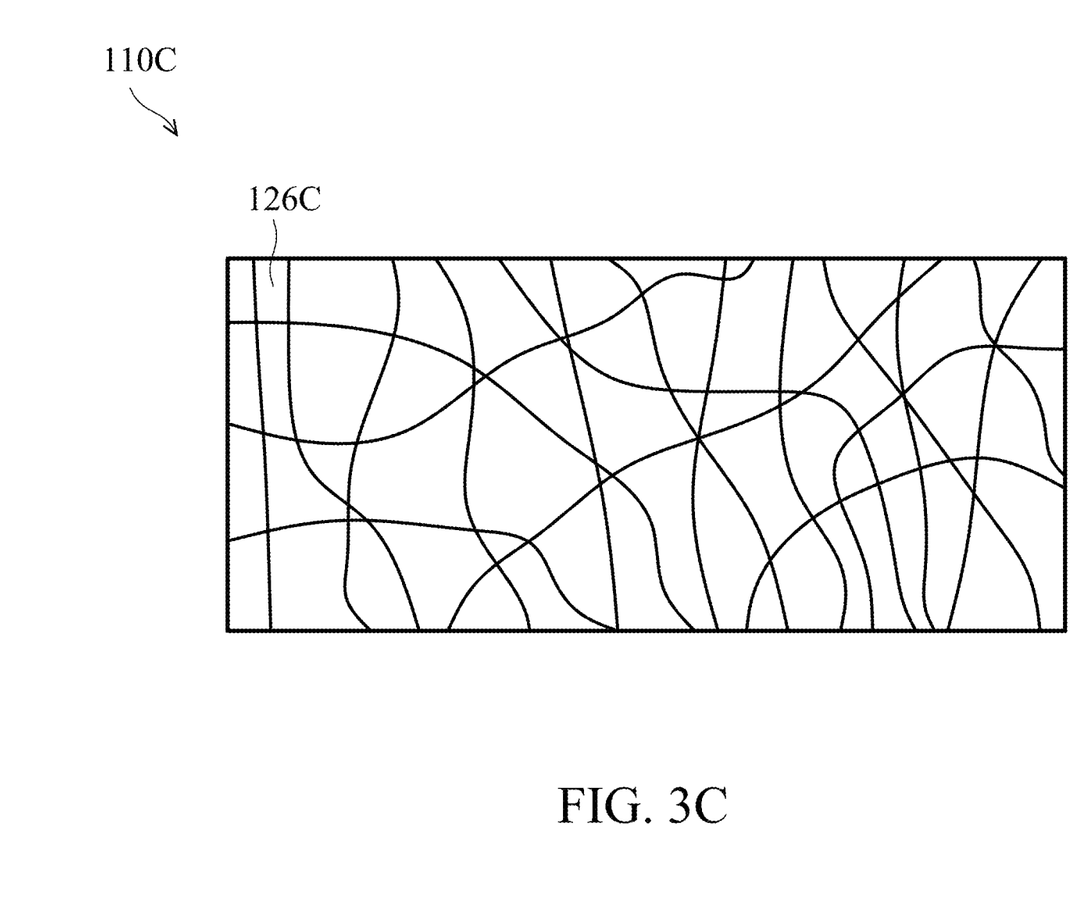
FIG. 3C is a cross-sectional view of a vent structure in accordance with some other embodiments of the present disclosure.

FIG. 3C is a cross-sectional view of the vent structure 110C in accordance with some embodiments of the present disclosure. As shown in FIG. 3C, the vent structure 110C includes a number of sub-ventilation holes 126C, in accordance with some embodiments. As shown in FIG. 3C, the vent structure 110C has a random network type structure.

Referring back to FIGS. 2A and 4A, the pellicle-mask structure 100 further includes first heat-dissipating fillers 128 positioned in the pellicle membrane adhesive 114. In some embodiments, the first heat-dissipating filler 128 is made of aluminum nitride, boron nitride, aluminum oxide, magnesium oxide, silicon oxide, graphite, metal powder, ceramic powder, another suitable material, or a combination thereof.

In some cases, when the EUV lithography processes are being performed, a high-energy light beam penetrates through the pellicle membrane. Therefore, the temperature of the pellicle membrane is increased. As a result, in some cases, the pellicle membrane breaks due to the high temperature.

Figure 4A:
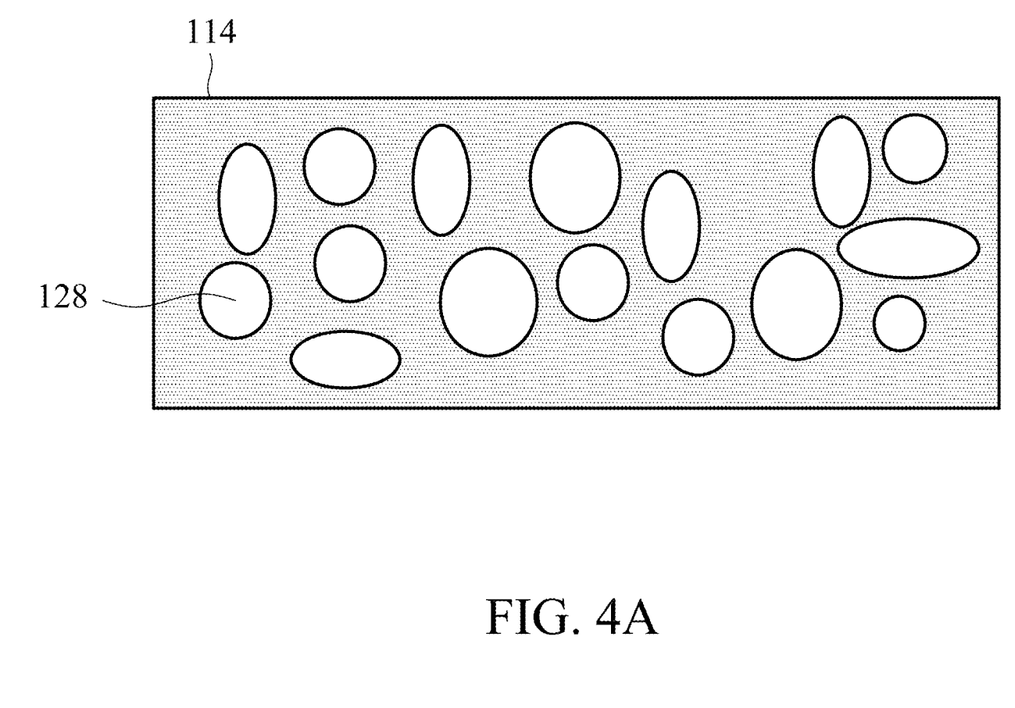
FIG. 4A is a cross-sectional view of a pellicle membrane adhesive in accordance with some embodiments of the present disclosure.
Figure 4B:
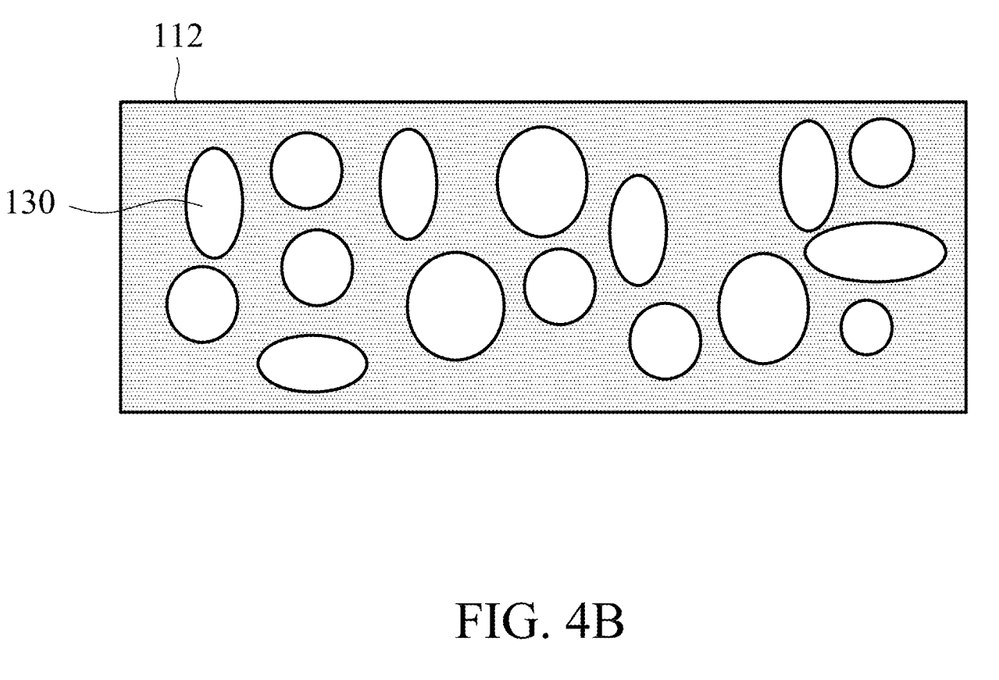
FIG. 4B is a cross-sectional view of a pellicle frame adhesive in accordance with some embodiments of the present disclosure.

In some embodiments, the first heat-dissipating fillers 128 can help to dissipate the heat of the pellicle membrane 116 through the pellicle membrane adhesive 114, the pellicle frame 106, the pellicle frame adhesive 112 to the mask 18 and the EUV lithography apparatus. Thereby, in some embodiments, the temperature of the pellicle membrane 116 decreases. As a result, the first heat-dissipating fillers 128 can help to prevent the pellicle membrane 116 from breaking during the EUV lithography processes. In some embodiments, the first heat-dissipating fillers 128 can disperse the charge on the pellicle membrane 116 to the EUV lithography apparatus and further help to prevent the pellicle membrane 116 from breaking.

However, the embodiments of the present disclosure are not limited thereto. In some other embodiments, no first heat-dissipating fillers 128 are positioned in the pellicle membrane adhesive 114.

Referring back to FIGS. 2A and 4A, the pellicle-mask structure 100 further includes second heat-dissipating fillers 130 positioned in the pellicle frame adhesive 112. In some embodiments, the second heat-dissipating filler 130 is made of aluminum nitride, boron nitride, aluminum oxide, magnesium oxide, silicon oxide, graphite, metal powder, ceramic powder, another suitable material, or a combination thereof.

In some embodiments, the second heat-dissipating fillers 130 can also help to dissipate the heat of the pellicle membrane 116 through the pellicle frame adhesive 112 to the mask 18 and the EUV lithography apparatus. Thereby, in some embodiments, the temperature of the pellicle membrane 116 decreases. As a result, the second heat-dissipating fillers 130 can help to prevent the pellicle membrane 116 from breaking during the EUV lithography processes. In some embodiments, the second heat-dissipating fillers 130 can disperse the charge on the pellicle membrane 116 and further help to prevent the pellicle membrane 116 from breaking.

However, the embodiments of the present disclosure are not limited thereto. In some other embodiments, no second heat-dissipating fillers 130 are positioned in the pellicle frame adhesive 112.

Still referring to FIG. 2A, the top membrane portion 120 of the pellicle membrane 116 has an upper surface 132 and a lower surface 134 opposite to each other, in accordance with some embodiments. In some embodiments, the pellicle membrane 116 is a continuous film in the top and the bottom portions, and the middle portion of the pellicle membrane 116 has a number of pores 138. As shown in FIG. 2A, the pellicle membrane 116 has a porous structure 136, and the porous structure 136 includes pores 138 in the pellicle membrane 116. In some embodiments, the pores 138 do not extend from the upper surface 132 to the lower surface 134. In some embodiments, the pores 138 are ring-shaped. Many variations and/or modifications can be made to embodiments of the disclosure. In some embodiments, the pellicle membrane 116 has a porous structure 136 extending from the upper surface 132 to the lower surface 134, in accordance with some embodiments. For example, the porous structure 136 includes a number of pores 138 in the pellicle membrane 116 and connecting the upper surface 132 and the lower surface 134.

In some embodiments, since the pellicle-mask structure 100 includes the porous structure 136 connecting the inner space 122 and the outer space 124, the pressure in the inner space 122 can be balanced with the pressure in the outer space 124 when the EUV lithography process is being performed. As a result, the porous structure 136 prevents the pellicle membrane 116 from breaking during the EUV lithography processes.

However, the embodiments of the present disclosure are not limited thereto. In some other embodiments, no porous structure 136 is positioned in the pellicle membrane 116.

Figure 5:
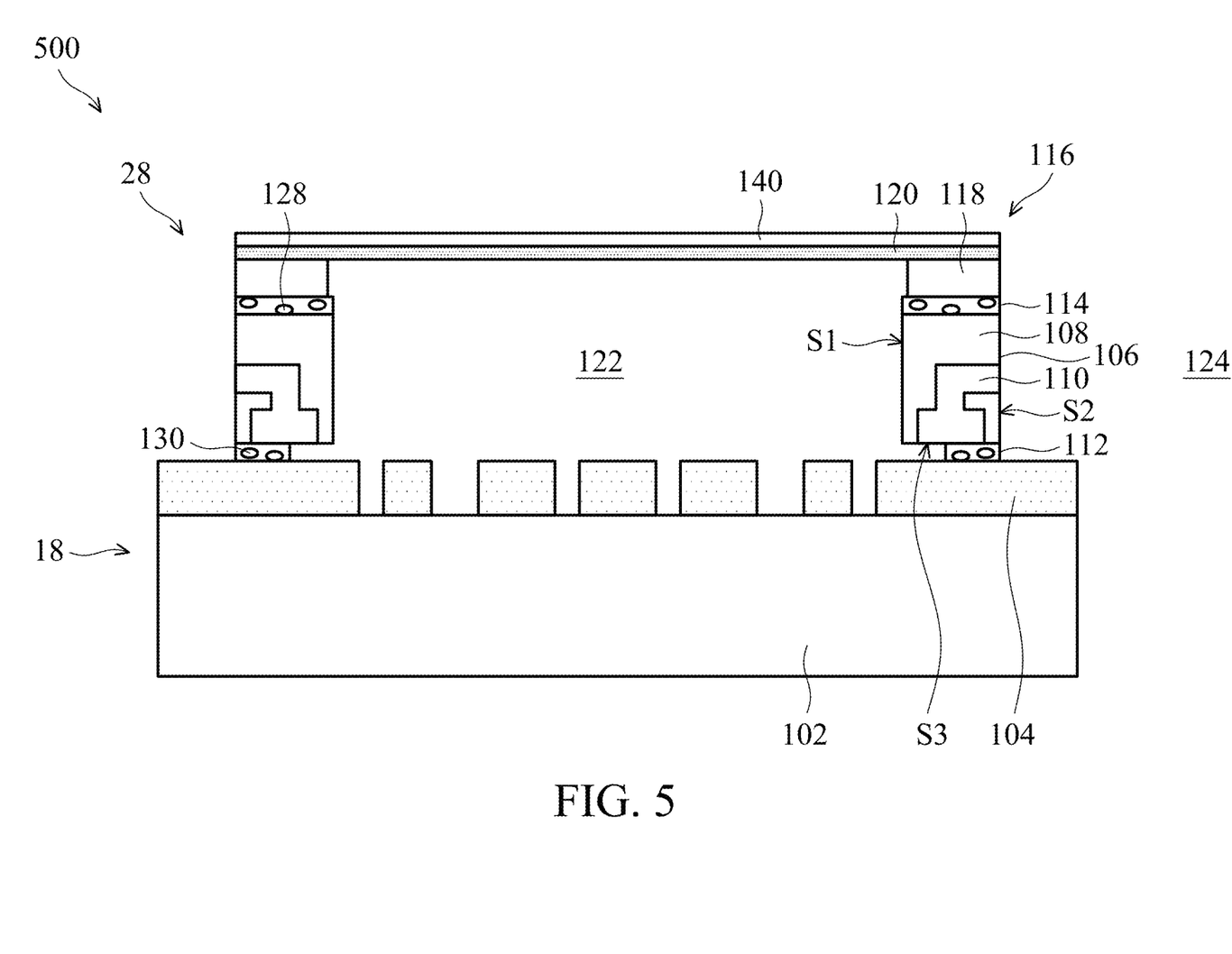
FIG. 5 is a cross-sectional view of a pellicle-mask structure in accordance with some other embodiments of the present disclosure.

It should be noted that the exemplary embodiment set forth in FIGS. 2A-4B is merely for the purpose of illustration. In addition to the embodiment set forth in FIGS. 2A-4B, the vent structure and the pellicle-mask structure could have other configuration as shown in FIG. 5. This will be described in more detail in the following description. Therefore, the present disclosure is not limited to the exemplary embodiment shown in FIGS. 2A-4B.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

FIG. 5 is a cross-sectional view of a pellicle-mask structure 500 in accordance with some other embodiments of the present disclosure. As shown in FIG. 5, the vent structure 110 with sub-ventilation holes 126 is positioned in the side portion 108 and connects the bottom surface S3 and the outside surface S2 through the side portion 108, in accordance with some embodiments. As shown in FIG. 5, the vent structure 110 connects the inner space 122 and the outer space 124, in accordance with some embodiments.

In addition, as shown in FIG. 5, no porous structure is positioned in the pellicle membrane 116, in accordance with some embodiments. Furthermore, as shown in FIG. 5, the pellicle-mask structure 100 further includes a heat-dissipating layer 140 positioned over the membrane portion 120 of the pellicle membrane 116, in accordance with some embodiments.

In some embodiments, the heat-dissipating layer 140 is made of Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, oxide such as silicon oxide, nitride such as silicon nitride, oxynitride such as silicon oxynitride, another suitable material, or a combination thereof. In some embodiments, the heat-dissipating layer 140 is disposed above or underneath the membrane portion 120. In some embodiments, the heat-dissipating layer 140 is a single layer. In some embodiments, the heat-dissipating layer 140 is a dual or a multiple layers stacking.

In some embodiments, the heat-dissipating layer 140 can further help to dissipate the heat of the pellicle membrane 116 through the pellicle membrane adhesive 114, the pellicle frame 106, the pellicle frame adhesive 112 to the mask 18 and the EUV lithography apparatus. Thereby, in some embodiments, the temperature of the pellicle membrane 116 decreases. As a result, the heat-dissipating layer 140 can further help to prevent the pellicle membrane 116 from breaking during the EUV lithography processes.

Embodiments of the disclosure use the vent structure to balance the pressure in the inner space with the pressure in the outer space when the EUV lithography process is being performed. As a result, the vent structure prevents the pellicle membrane from breaking during the EUV lithography processes.

In addition, in some embodiments, the heat-dissipating fillers in the pellicle frame adhesive and/or pellicle membrane adhesive can help to dissipate the heat of the pellicle membrane to the mask and the EUV lithography apparatus. Thereby, in some embodiments, the temperature of the pellicle membrane decreases. As a result, the heat-dissipating fillers can help to prevent the pellicle membrane from breaking during the EUV lithography processes.

Furthermore, in some embodiments, the porous structure can balance the pressure in the inner space with the pressure in the outer space when the EUV lithography process is being performed. As a result, the porous structure prevents the pellicle membrane from breaking during the EUV lithography processes. In addition, in some embodiments, the pellicle-mask structure further includes a heat-dissipating layer positioned over the pellicle membrane to dissipate the heat of the pellicle membrane and prevent the pellicle membrane from breaking during the EUV lithography processes.

Embodiments of the disclosure are not limited and may be applied to fabrication processes for any suitable technology generation. Various technology generations include a 20 nm node, a 16 nm node, a 10 nm node, or another suitable node.

In accordance with some embodiments, a method for forming a structure of a pellicle-mask structure is provided. The method includes forming a mask pattern on a mask substrate. The method also includes bonding a pellicle frame to the mask pattern through a pellicle frame adhesive. The method further includes forming a vent structure in the pellicle frame. In addition, the method includes bonding a pellicle membrane to the pellicle frame. The pellicle membrane includes a peripheral portion over the pellicle frame and a top membrane portion over the peripheral portion, and a lateral width of the peripheral portion of the pellicle membrane is greater than a lateral width of the pellicle frame adhesive.

In accordance with some embodiments, a method for forming a structure of a pellicle-mask structure is provided. The method includes bonding a pellicle frame to a mask through a pellicle frame adhesive. The method also includes forming a vent structure in the pellicle frame. A first portion of a bottom surface of the vent structure exposes a space between the pellicle frame and the mask. The method further includes disposing a heat-dissipating layer over the pellicle frame.

In accordance with some embodiments, a method for forming a structure of a pellicle-mask structure is provided. The method includes bonding a pellicle frame to a mask through a pellicle frame adhesive. The method also includes forming an opening in the pellicle frame. The method further includes disposing a vent structure into the opening. In addition, the method includes bonding a pellicle membrane to the pellicle frame through a pellicle membrane adhesive. The pellicle membrane, the pellicle membrane adhesive, the pellicle frame, the pellicle frame adhesive and the mask enclose an inner space. A first lateral width of a lower portion of the inner space is greater than a second lateral width of an upper portion of the inner space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from spirit and scope of the present disclosure, and that they may make various changes, substitutions, and alterations herein without departing from the spirit and scope of the present disclosure.

What is claimed is:

1. A method for forming a pellicle-mask structure, comprising:
    forming a mask pattern on a mask substrate;
    bonding a pellicle frame to the mask pattern through a pellicle frame adhesive;
    forming a vent structure in the pellicle frame; and
    bonding a pellicle membrane to the pellicle frame, wherein the pellicle membrane includes a peripheral portion over the pellicle frame and a top membrane portion over the peripheral portion, and a lateral width of the peripheral portion of the pellicle membrane is greater than a lateral width of the pellicle frame adhesive.

2. The method for forming the pellicle-mask structure as claimed in claim 1, wherein the pellicle membrane is bonded to the pellicle frame through a pellicle membrane adhesive.

3. The method for forming the pellicle-mask structure as claimed in claim 2, wherein a lateral width of the pellicle membrane adhesive is greater than a lateral width of the pellicle frame adhesive.

4. The method for forming the pellicle-mask structure as claimed in claim 3, wherein an outer sidewall of the pellicle membrane adhesive is substantially aligned with an outer sidewall of the pellicle frame adhesive.

5. The method for forming the pellicle-mask structure as claimed in claim 1, wherein an inner sidewall of the vent structure protrudes from an inner sidewall of the pellicle frame adhesive.

6. The method for forming the pellicle-mask structure as claimed in claim 1, wherein a lateral width of the pellicle frame is greater than a lateral width of the pellicle frame adhesive.

7. The method for forming the pellicle-mask structure as claimed in claim 1, wherein a lateral width of the vent structure is greater than a lateral width of the pellicle frame adhesive.

8. The method for forming the pellicle-mask structure as claimed in claim 1, wherein the peripheral portion of the pellicle membrane is made of a material that is different from that of the top membrane portion of the pellicle membrane.

9. The method for forming the pellicle-mask structure as claimed in claim 1, wherein the mask pattern has a plurality of openings exposing the mask substrate.

10. The method for forming the pellicle-mask structure as claimed in claim 1, wherein forming the vent structure comprises:
    forming an opening in the pellicle frame, wherein the opening penetrates through an inner surface and an outer surface of the pellicle frame; and
    placing the vent structure into the opening.

11. A method for forming a pellicle-mask structure, comprising:
    bonding a pellicle frame to a mask through a pellicle frame adhesive;
    forming a vent structure in the pellicle frame, wherein a first portion of a bottom surface of the vent structure exposes a space between the pellicle frame and the mask; and
    disposing a heat-dissipating layer over the pellicle frame.

12. The method for forming the pellicle-mask structure as claimed in claim 11, wherein a second portion of the bottom surface of the vent structure exposes the pellicle frame adhesive.

13. The method for forming the pellicle-mask structure as claimed in claim 11, wherein an inner sidewall of the vent structure is between an inner sidewall of the pellicle frame adhesive and an inner sidewall of the pellicle frame.

14. The method for forming the pellicle-mask structure as claimed in claim 11, wherein an outer sidewall of the vent structure is between an outer sidewall of the pellicle frame adhesive and an inner sidewall of the pellicle frame adhesive.

15. The method for forming the pellicle-mask structure as claimed in claim 11, wherein the vent structure connects a bottom surface of the pellicle frame and an outside surface of the pellicle frame.

16. The method for forming the pellicle-mask structure as claimed in claim 11, wherein the heat-dissipating layer is made of Zr, Nb, Mo, Cd, Ru, Ti, Al, Mg, V, Hf, Ge, Mn, Cr, W, Ta, Ir, Zn, Cu, Fe, Co, Au, Pt, Sn, Ni, Te, Ag, silicon oxide, silicon nitride, or silicon oxynitride.

17. A method for forming a pellicle-mask structure, comprising:
    bonding a pellicle frame to a mask through a pellicle frame adhesive;
    forming an opening in the pellicle frame;
    disposing a vent structure into the opening; and
    bonding a pellicle membrane to the pellicle frame through a pellicle membrane adhesive, wherein the pellicle membrane, the pellicle membrane adhesive, the pellicle frame, the pellicle frame adhesive and the mask enclose an inner space, and a first lateral width of a lower portion of the inner space is greater than a second lateral width of an upper portion of the inner space.

18. The method for forming the pellicle-mask structure as claimed in claim 17, wherein the mask includes a mask substrate and a mask pattern over the mask substrate.

19. The method for forming the pellicle-mask structure as claimed in claim 18, wherein the inner space extends through the mask pattern.

20. The method for forming the pellicle-mask structure as claimed in claim 18, wherein the inner space exposes a top surface of the mask substrate.

\* \* \* \* \*